(12) United States Patent
Boyle et al.

(10) Patent No.: US 7,962,870 B2
(45) Date of Patent: Jun. 14, 2011

(54) PREDICTION OF DYNAMIC CURRENT WAVEFORM AND SPECTRUM IN A SEMICONDUCTOR DEVICE

(75) Inventors: Peter Boyle, Mountain View, CA (US); Iliya G. Zamek, San Jose, CA (US); Zhe Li, Sunnyvale, CA (US); Shishuang Sun, San Jose, CA (US); Bozidar Krsnik, Simi Valley, CA (US); James L. Drewniak, Rolla, MO (US); Xiaohe Chen, Cupertino, CA (US); Sandeep Kamalakar Reddy Chandra, Dearborn, MI (US)

(73) Assignee: Altera Corporation, San Jose, CA (US)

( * ) Notice: Subject to any disclaimer, the term of this patent is extended or adjusted under 35 U.S.C. 154(b) by 484 days.

(21) Appl. No.: 12/116,095

(22) Filed: May 6, 2008

(65) Prior Publication Data
US 2008/0288898 A1 Nov. 20, 2008

Related U.S. Application Data

(60) Provisional application No. 60/916,571, filed on May 8, 2007.

(51) Int. Cl.
*G06F 17/50* (2006.01)
(52) U.S. Cl. ........ 716/108; 716/109; 716/111; 716/113; 716/115; 716/118; 716/120; 716/132; 716/133; 703/14; 703/19
(58) Field of Classification Search .................. 716/1–6; 327/170, 551, 558
See application file for complete search history.

(56) References Cited

U.S. PATENT DOCUMENTS

| | | | |
|---|---|---|---|
| 5,729,145 A * | 3/1998 | Blades | 324/536 |
| 6,308,300 B1 * | 10/2001 | Bushnell et al. | 716/136 |
| 7,039,572 B1 * | 5/2006 | Narahara et al. | 703/14 |
| 7,222,033 B1 * | 5/2007 | Newson et al. | 702/65 |
| 7,312,646 B2 * | 12/2007 | Jorgenson et al. | 327/170 |
| 7,533,357 B2 * | 5/2009 | Carlsen et al. | 716/136 |
| 7,583,065 B2 * | 9/2009 | Xu et al. | 323/266 |
| 7,809,543 B2 * | 10/2010 | Chiu et al. | 703/15 |
| 2003/0212973 A1 * | 11/2003 | Lin et al. | 716/6 |

OTHER PUBLICATIONS

Huang et al.; "The impact of capacitors selection and placement to the ESL and ESR"; Publication Year: 2005; Electronics Materials and Packaging, 2005. EMAP 2005. International Symposium on; pp. 258-261.*

(Continued)

*Primary Examiner* — Helen Rossoshek
(74) *Attorney, Agent, or Firm* — Martine Penilla & Gencarella, LLP

(57) ABSTRACT

A method for determining a current spectrum for a circuit design is provided. The method includes determining timing characteristics and power consumption characteristics for the circuit design. From the timing characteristics and the power consumption characteristics a time domain current waveform is constructed. The time domain current waveform is then converted to a frequency domain current waveform. With the frequency domain waveform, one skilled in the art can then identify a location and an amount of decoupling capacitors for a printed circuit board housing the circuit design based on the frequency domain current waveform. A computing system configured to perform the method is also provided.

20 Claims, 10 Drawing Sheets

OTHER PUBLICATIONS

Hattori et al.; "Optimal placement of decoupling capacitors on PCB using Poynting vectors obtained by FDTD method"; Publication Year: 2002; Circuits and Systems, 2002. ISCAS 2002. IEEE International Symposium on; vol. 5; pp. V-29-V-32 vol. 5.*

Na et. al.; "The effects of on-chip and package decoupling capacitors and an efficient ASIC decoupling methodology"; Publication Year: 2004; Electronic Components and Technology Conference, 2004. Proceedings. 54th; vol. 1; pp. 556-567 vol. 1.*

* cited by examiner

PREDICTION OF DYNAMIC CURRENT WAVEFORM AND SPECTRUM IN A SEMICONDUCTOR DEVICE

CROSS REFERENCE TO RELATED APPLICATIONS

This application claims priority from U.S. Provisional Patent Application No. 60/916,571, filed May 8, 2007, and entitled "Prediction of Dynamic Current Waveform and Spectrum in a Semiconductor Device." This provisional application is herein incorporated by reference.

BACKGROUND

Semiconductors contain complex circuits which draw significant current during use. Direct current (DC) components of the current are relatively simple to predict and account for. However, alternating current (AC) components have frequency content which must be carefully accounted for in a power distribution network design on a die, package, and printed circuit board. Traditional techniques utilize a broadband frequency compensation, which adds cost and complexity to designs. Printed circuit board manufacturers will typically need to understand how much current will be drawn when a chip is in use in order to design an optimal printed circuit board. The data will determine an amount and a location for decoupling capacitors over this printed circuit board in order to ensure the chip can operate without interference. As chip manufacturers do not have the proper tools or resources to provide a detailed analysis for the printed circuit board manufacturers, the chip manufacturers tend to over-recommend to cover a worse-case situation. This over recommendation is typically ignored by the printed circuit board manufacturers since the over recommendation would cost too much for the printed circuit board manufacturers to accommodate. That is, the chip manufacturers try to make a broad spectrum recommendation to cover all frequencies, when only certain frequencies need to be covered with respect to impedance. Thus, this approach tends to yield data of limited value for the printed circuit board manufacturers.

Accordingly, there is a need to provide a tool for chip manufacturers and printed circuit board manufacturers to better understand the dynamic current waveform to consider when placing a chip on a printed circuit board.

SUMMARY

Embodiments of the present invention provide a method and a framework for calculating a current spectrum for a circuit design. It should be appreciated that the present invention can be implemented in numerous ways, such as a process, an apparatus, a system, a device or a method on a computer readable medium. Several inventive embodiments of the present invention are described below.

In one aspect of the invention, a method for determining a current spectrum for a circuit design is provided. The method includes determining timing characteristics and power consumption characteristics for the circuit design. In one embodiment, the timing characteristics are provided through a electronic design automation tool (EDA), such as the QUARTUS™ tool of ALTERA CORPORATION. The timing characteristics yield a current pulse time width. In another embodiment, the power consumption characteristics are provided by an EDA tool, such as the QUARTUS™ tool of ALTERA CORPORATION. The power consumption characteristics yield a current pulse amplitude. From the timing characteristics and the power consumption characteristics a time domain current waveform is constructed. The time domain current waveform is then converted to a frequency domain current waveform, e.g., through a Fast Fourier transform in one embodiment. With the frequency domain waveform, one skilled in the art can then identify a location and an amount of decoupling capacitors for a printed circuit board housing the circuit design based on the frequency domain current waveform. In another embodiment, the method operations may be embodied onto a computer readable medium and stored onto a computing system. The computing system may then be used to analyze a circuit design as discussed below.

Other aspects of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

DETAILED DESCRIPTION

The embodiments described herein provide a tool for simplifying the design of integrated circuits. It will be obvious, however, to one skilled in the art, that the present invention may be practiced without some or all of these specific details. In other instances, well known process operations have not been described in detail in order not to unnecessarily obscure the present invention.

The embodiments described below provide a tool that predicts a current spectrum so that an optimal power distribution network (PDN) may be associated with the current spectrum. In one embodiment, a timing analyzer tool will provide the timing associated with the particular design as one input into the embodiments described below. A power consumption value is also provided as input and the power consumption may be provided through any number of tools which predict the total current being drawn by the chip design. This information is then processed as described in more detail below in order to provide a waveform of current so that this waveform can be combined with the transfer impedance in order to enable a printed circuit board manufacturer to accurately determine the location and how many decoupling capacitors to place on the printed circuit board for the chip design.

Figure 1:
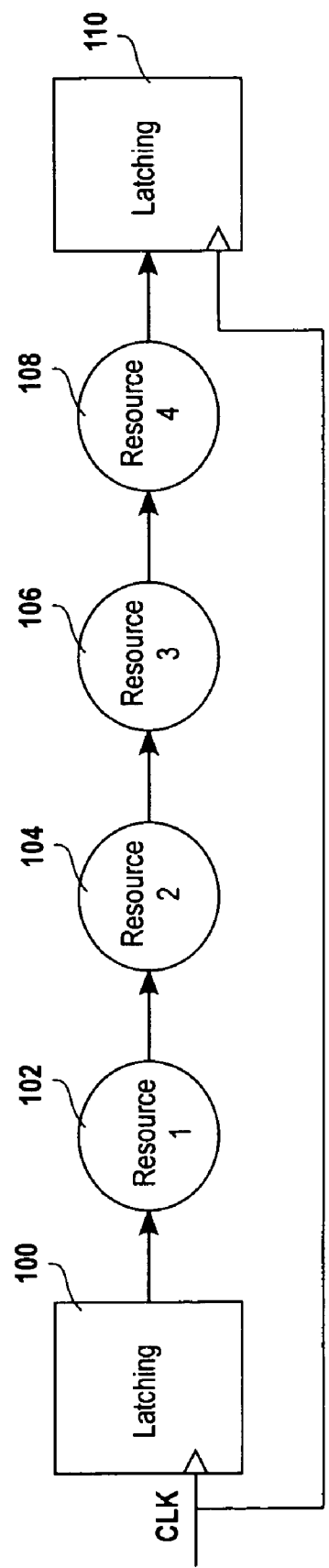
FIG. 1 is a simplified schematic diagram illustrating the timing aspects associated with a pathway within one aspect of an integrated circuit in accordance with one embodiment of the invention.

FIG. 1 is a simplified schematic diagram illustrating the timing aspects associated with a pathway within one aspect of an integrated circuit in accordance with one embodiment of the invention. Launching register 100 communicates with latching register 110 through a path traversing a number of resources. In particular, launching register 100 provides an output to resource 1 102, which is in communication with resource 2 104. Resource 2 104 in turn, provides output to resource 3 106. Resource 3 106 provides output to resource 4 108, which subsequently provides output to latching register 110. A clock signal is provided to launching flip flop 100 and latching register 110. The timing aspects must be considered in order to ensure that data at latching register 110 is stable by the time the next clock edge arrives. Resources 1 through 4, 102 through 108, represent any logic that manipulates data in order to provide an output to latching register 110. In one embodiment, the logic may be any logic currently utilized by programmable logic devices (PLDs), such as the PLDs provided by ALTERA CORPORATION. It should be appreciated that with each of the resources 102 through 108 there is a time associated with the processing. For example, resource 1 may have a processing time of 100 picoseconds, resource 2 200 picoseconds, resource 3 300 picoseconds, resource 4 100 picoseconds, while latching register may require a 100 picoseconds setup time in order to ensure that the data is stable. Thus, adding up each of these times provides 800 picoseconds of time. The clock cycle is one nanosecond in this exemplary situation. As will be explained in more detail below, the 800 picoseconds fly time calculated above will become a time width of the current waveform as determined by the embodiments below in one exemplary situation.

Figure 2:
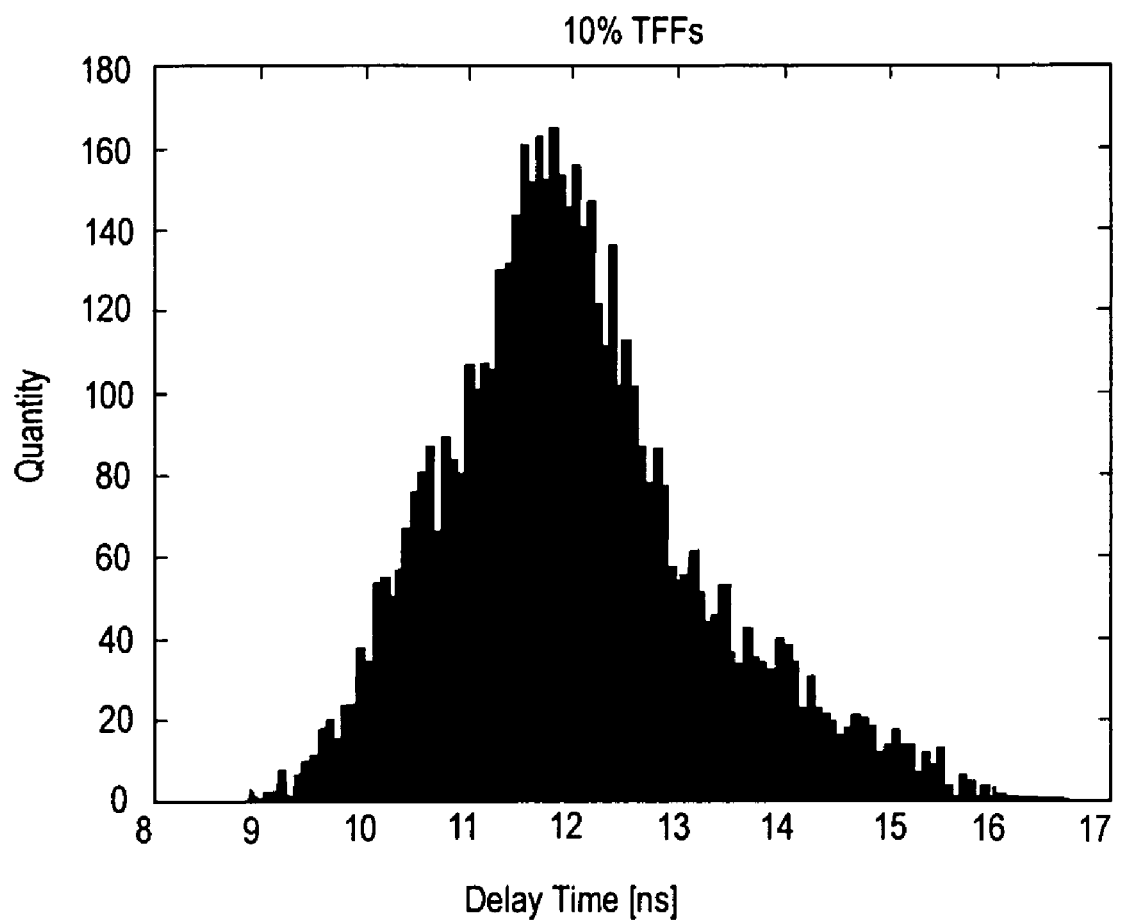
FIG. 2 is a graphical illustration of the path delay distribution extracted from a timing analysis in accordance with one embodiment of the invention.

FIG. 2 is a graphical illustration of the path delay distribution extracted from a timing analysis in accordance with one embodiment of the invention. The x axis of FIG. 2 represents a delay time in nano seconds, while the y axis represents a number of toggle flip flops (TFF) that are switching. One skilled in the art will appreciate that common circuit design analysis tools produce path by path analysis of the propagation through each logical path of the design. Each of these paths has a start time and end time, and from this information a circuit activity distribution may be reconstructed as illustrated in FIG. 2. Accordingly, FIG. 2 represents the delay distribution for a group of toggle flip flops extracted in one exemplary embodiment and is not meant to be limiting as the path delay distribution is dependent on the circuit design.

Figure 3:
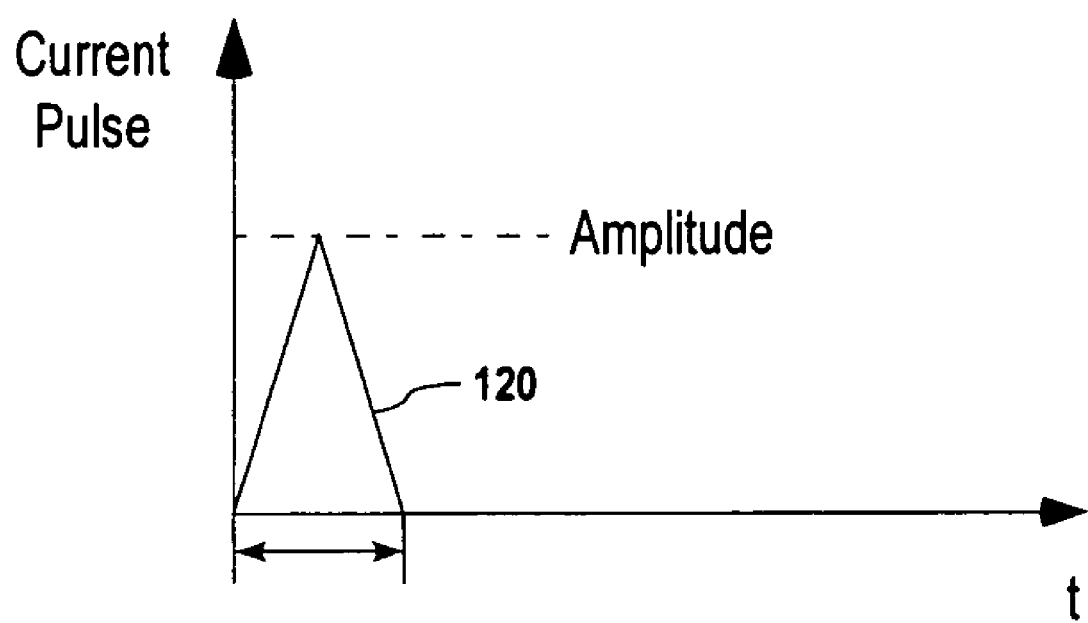
FIG. 3 is a simplified schematic diagram illustrating an assumed current shape for each path in the circuit design in accordance with one embodiment of the invention.

FIG. 3 is a simplified schematic diagram illustrating an assumed current shape for each path in the circuit design in accordance with one embodiment of the invention. Under current power consumption analyses, the switching activity current is estimated for a circuit design. In one embodiment, the analysis estimates a certain amount of current drawn by a circuit each time the logic of the circuit switches. In one embodiment, one such tool available for providing this estimate is the POWER PLAY™ tool available from ALTERA CORPORATION. However, other suitable tools may be used to estimate the current drawn by each path.

In FIG. 3, a triangular shape 120 has been provided in this embodiment. Triangular shape 120 for the assumed current shape has an amplitude and a time width. Referring back to FIG. 1, assuming that the exemplary path of FIG. 1 is being used, the time width on the x axis of FIG. 3 would represent the 800 picoseconds referred to in FIG. 1. One skilled in the art will appreciate that since there is a time delay associated with the signal processing through a path, the current shape will not be a simple instantaneous pulse. It should be noted that for the analysis provided herein, it is assumed that each TFF draws the same amount of current. The amplitude of the current drawn is represented on the y axis. Thus, triangular shape 120 captures both the time and amount of current through the logical pathway. It should be further noted that with reference to FIG. 2, each data point may be represented as a triangular shape illustrated in FIG. 3 in order to provide the cumulative representation to yield the agglomerated distribution of FIG. 2.

Figure 4:
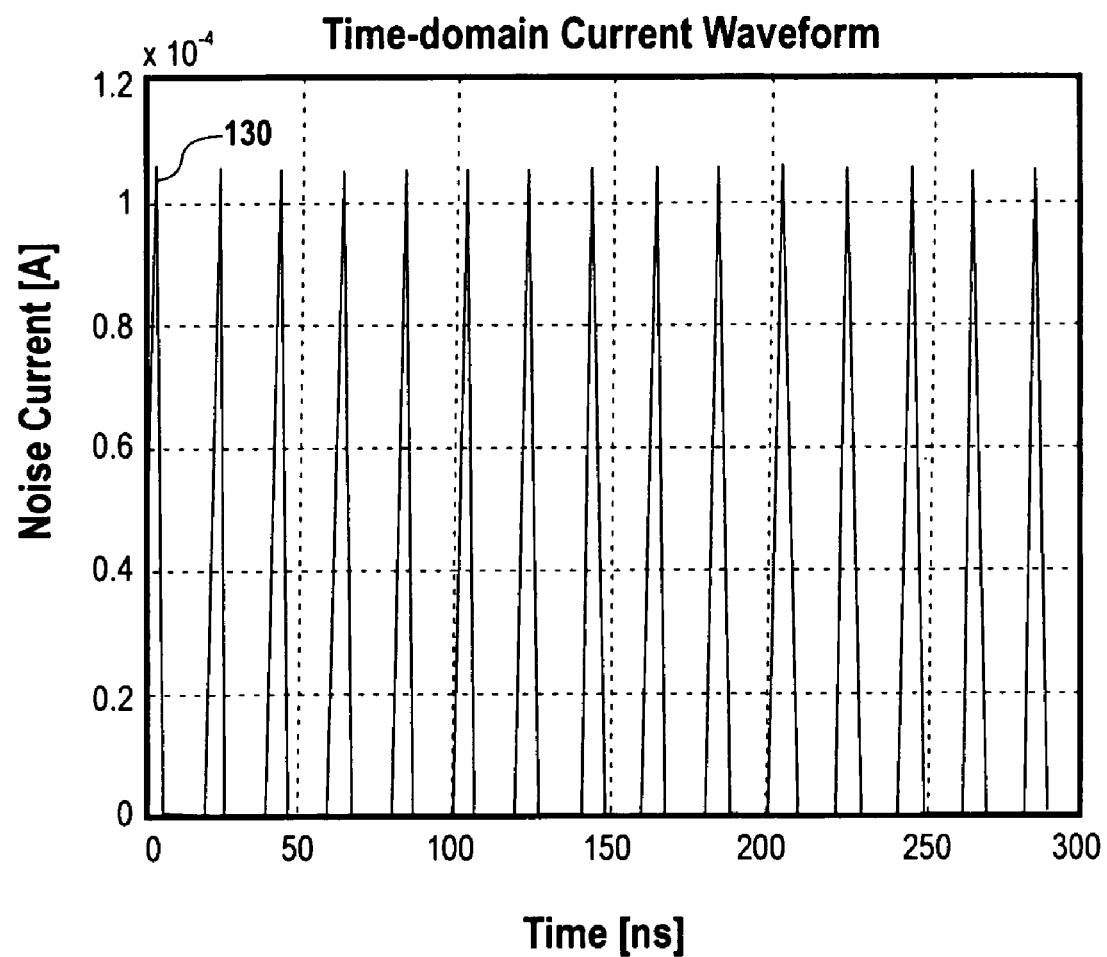
FIG. 4 is a reconstructed dynamic current waveform for the toggle flip flops described herein in accordance with one embodiment of the invention.
Figure 5:
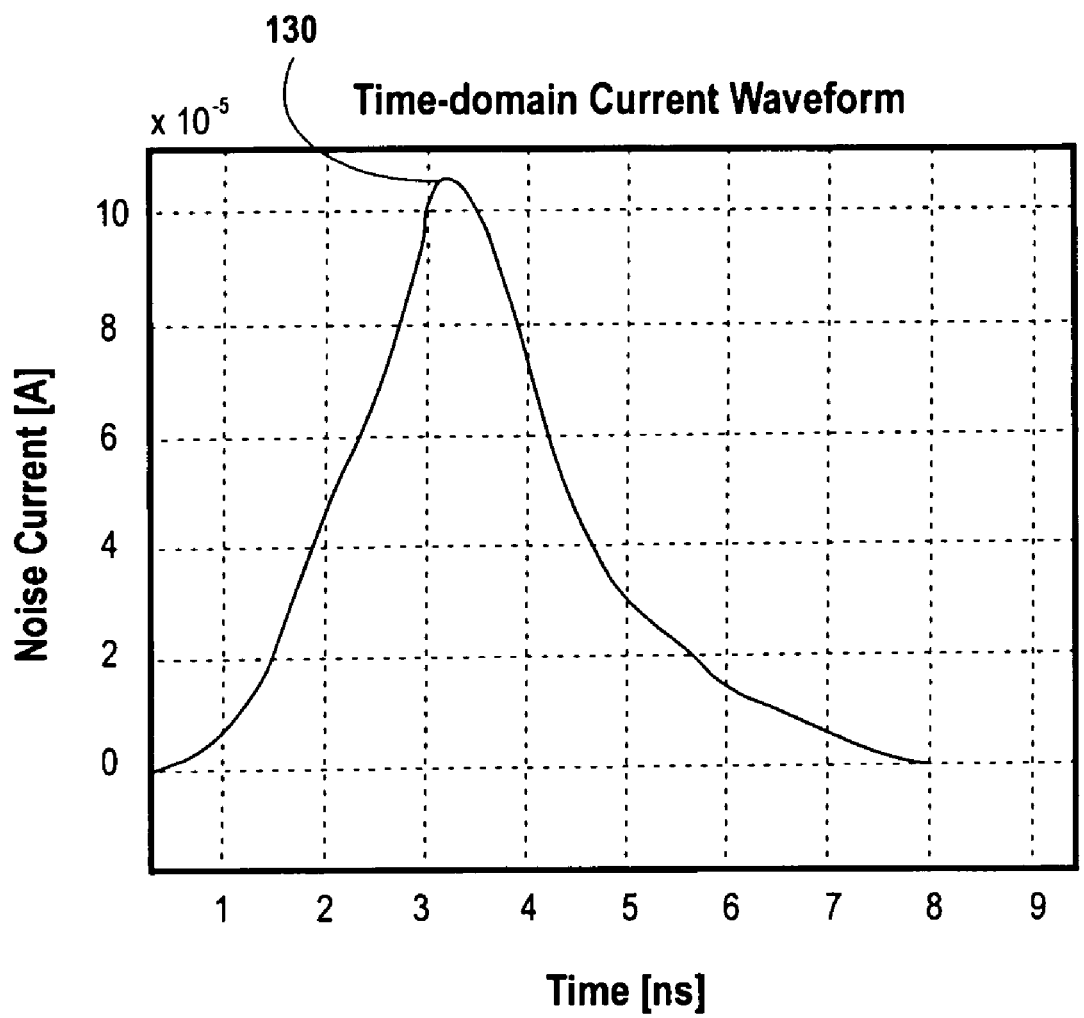
FIG. 5 is a simplified graphical representation which expands a peak of FIG. 4.

FIG. 4 is a reconstructed dynamic current waveform for the toggle flip flops described herein in accordance with one embodiment of the invention. In FIG. 4, peak 130 occurs at each clock cycle as illustrated in the graph where time is represented on the x axis in nanoseconds and noise current in amps is represented in the y axis. FIG. 5 is a simplified graphical representation which zooms in on peak 130 of FIG. 4. FIGS. 3 through 5 provide waveforms in the time domain. In order to make use of these waveforms for PDN design and power fluctuation analysis, the time domain waveform is converted to the frequency domain using standard techniques, e.g., Fourier transform. One skilled in the art will appreciate that cycles per second and the coulombs per second may be used to determine the coulombs per cycle in order to assist with the generation of FIG. 4.

Figure 6:
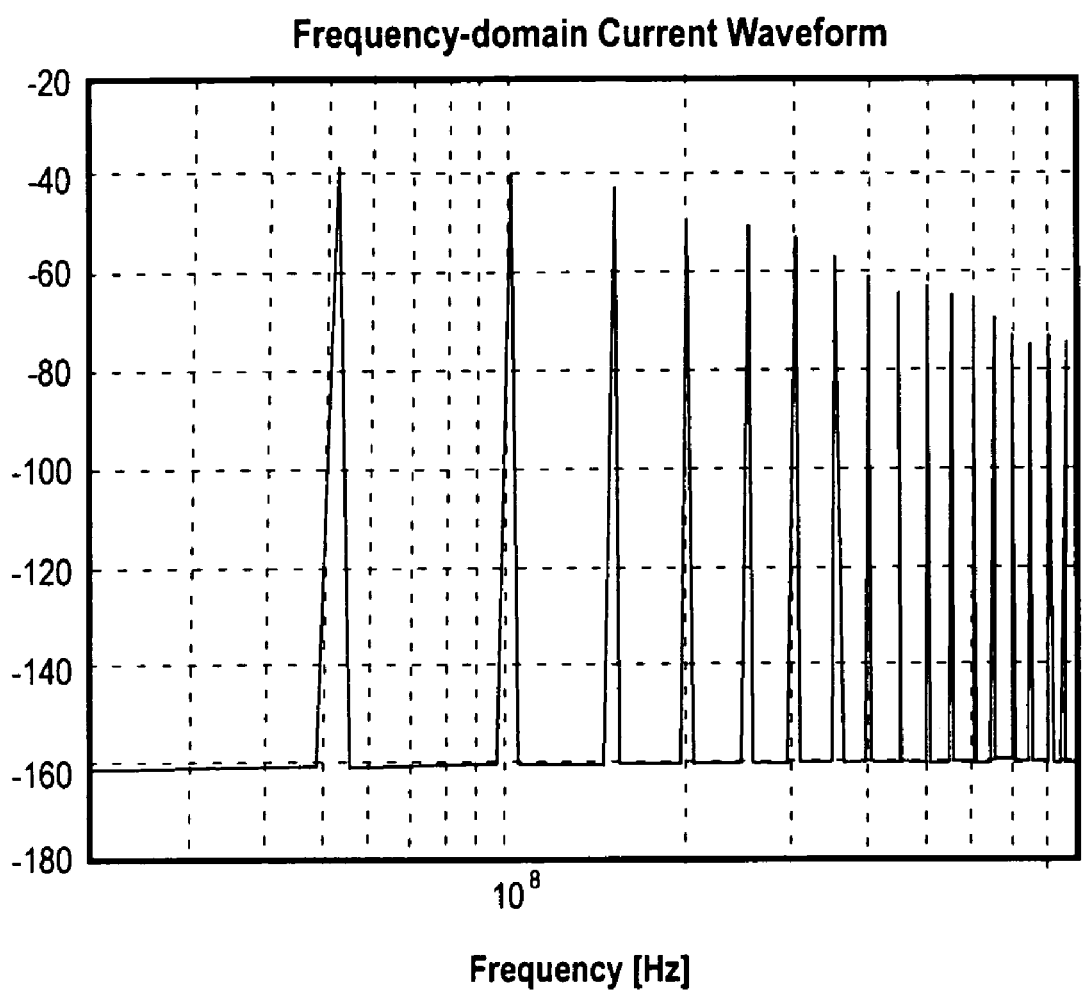
FIG. 6 is a graphical representation of the reconstructed dynamic current waveform for the toggle flip flops in the frequency domain in accordance with one embodiment of the invention.

FIG. 6 is a graphical representation of the reconstructed dynamic current waveform for the toggle flip flops in the frequency domain in accordance with one embodiment of the invention. In FIG. 6, the time domain represented in FIG. 4 is converted to the frequency domain where the frequency is represented on the x axis and the noise current on the y axis. The spectrum represented in FIG. 6 is then converted to a power spectrum through the use of the formulas supplied below.

$$V = Iest \times Z21$$

$$Pest = \frac{V^2}{Z22}$$

Figure 7:
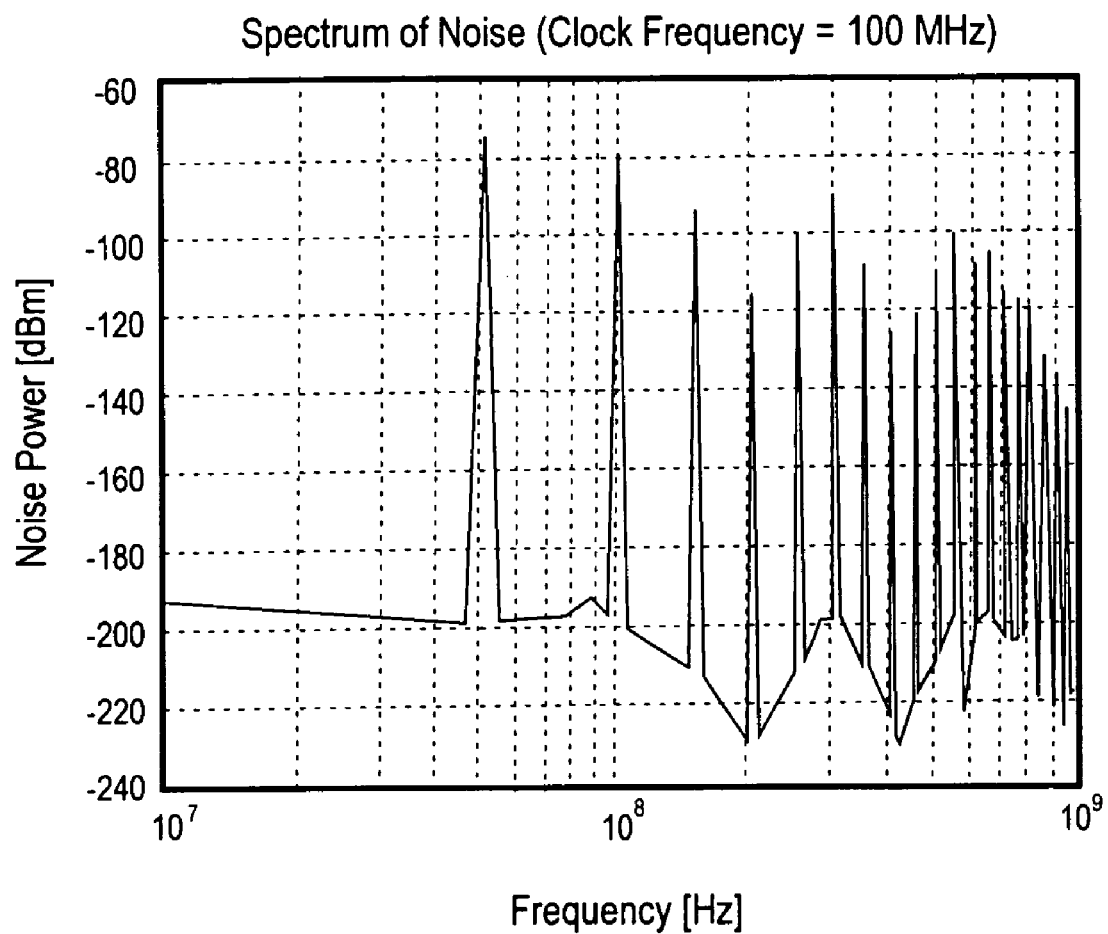
FIG. 7 represents the resulting power spectrum when calculations are applied to the reconstructed dynamic waveform of FIG. 6 in accordance with one embodiment of the invention.

In the above formulas, Iest is the estimated current illustrated in FIG. 6, P is the estimated power of FIG. 7, V is the voltage, and Z21 and Z22 represent the impedance of a test board.

FIG. 7 represents the resulting power spectrum when the calculations performed through the above equations are applied to FIG. 6. One skilled in the art will appreciate that the resulting power spectrum of FIG. 7 may be used to predict voltage fluctuations and inform a circuit designer how to improve the PDN design through standard techniques.

Figure 8:
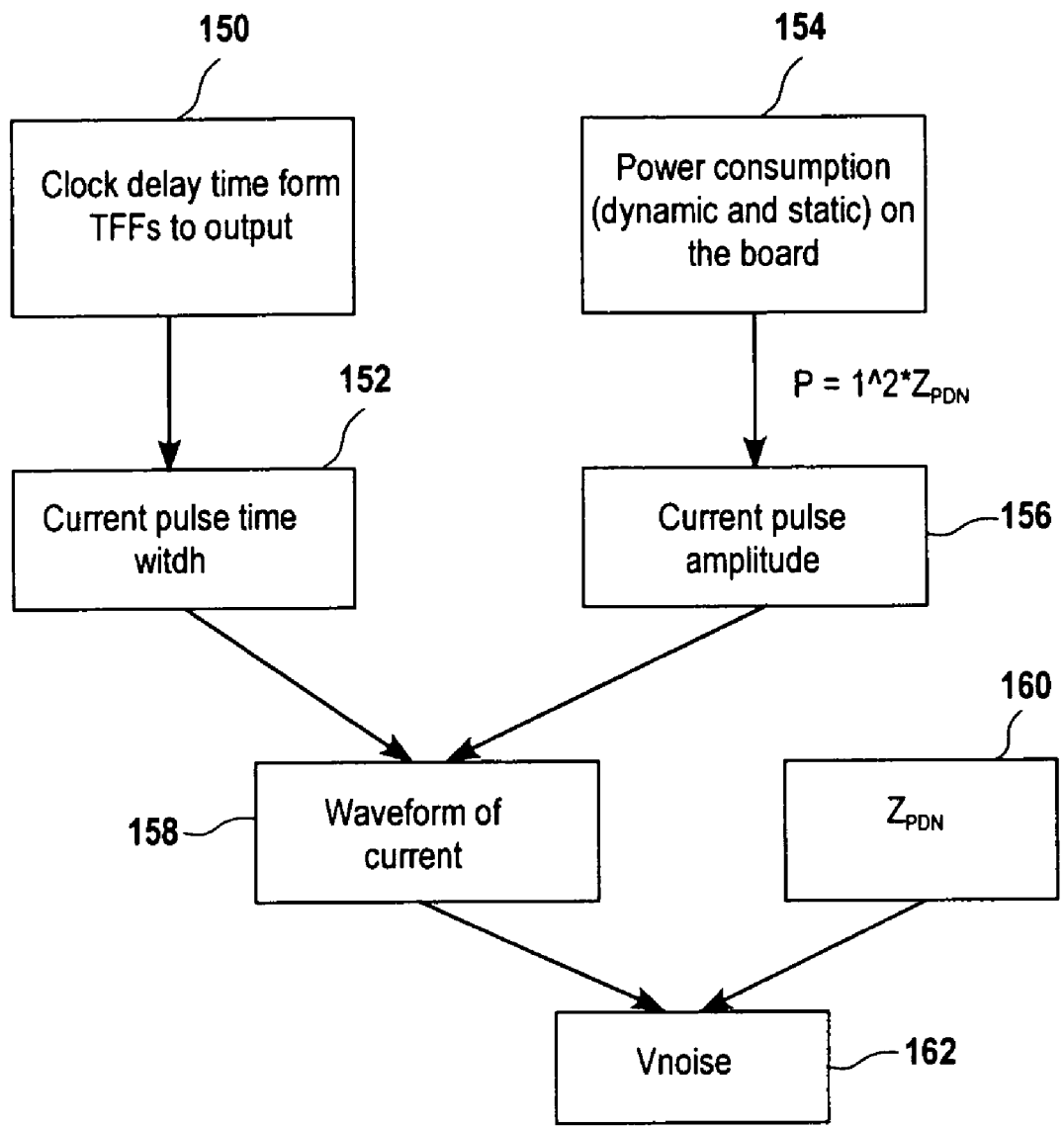
FIG. 8 is a simplified flow chart diagram illustrating method operations for predicting a dynamic current waveform in accordance with one embodiment of the invention.

FIG. 8 is a simplified flow chart diagram illustrating method operations for predicting a dynamic current waveform in accordance with one embodiment of the invention. In operation 150, the clock delay time from toggle flip flops to output for logical path is determined. For example, the logical path may be the logical path represented by FIG. 1. As discussed above, any synthesis tool may provide this data. In one exemplary embodiment, the clock delay time from the TFF's to an output is supplied through the QUARTUS™ timing analyzer of ALTERA CORPORATION. From the information gathered from operation 150, a current pulse time width is determined in operation 152. For example, the current pulse time width of FIG. 3 may be determined here, in one embodiment. In operation 154 power consumption, which includes both dynamic and static power consumption on a printed circuit board, is determined. As discussed above, the power consumption may be determined through a suitable commercially available tool such as the POWER PLAY™ tool available from ALTERA CORPORATION. In such a tool, the tool will look at the resources on the chip design and each resource is assigned a current value. The tool will then assume at any given time a certain percentage of these resources may switch in order to determine a dynamic current value. For example, the tool may determine that the design will draw four amps of total current, and of the four amps, three amps are static current and one amp is the dynamic current. From this data, a current pulse amplitude is determined in operation 156. Thus, with the current pulse amplitude and the current pulse time width, a shape may be assigned to the current waveform as described above with regards to FIG. 3 through 5. The waveform of noise is then generated in operation 158. Exemplary waveforms of noise are FIGS. 4 through 7. Combining the waveforms of noise in operation 158 with the transfer impedance determined in operation 160, will provide the spectrum of noise in operation 162. The transfer impedance may be determined through any commercially available tool configured to extract the impedance of a test board. As mentioned above, the reconstructed dynamic current waveform in the frequency domain of FIG. 6 may be converted to the waveform of FIG. 7 through the application of the formulas which take into account the impedance of a test board. In one embodiment, the impedance of the test board may be determined through a power plane analysis tool configured to extract this impedance.

Figure 9:
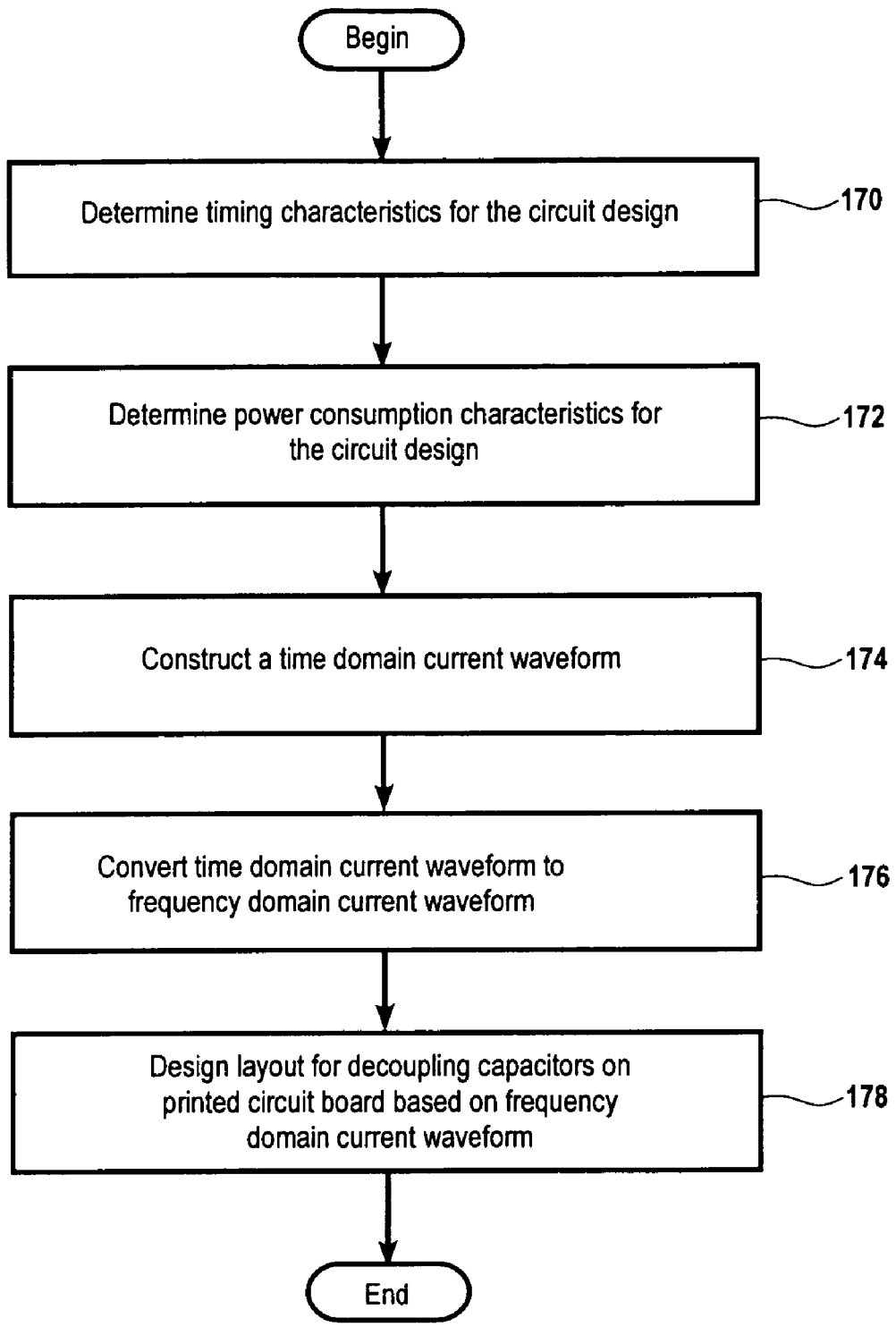
FIG. 9 is a flow chart diagram illustrating the method operations for determining a current spectrum for a circuit design in accordance with one embodiment of the invention.

FIG. 9 is a flow chart diagram illustrating the method operations for determining a current spectrum for a circuit design in accordance with one embodiment of the invention. The flow chart initiates with method operation 170 where timing characteristics for a circuit design are determined. In operation 170 the timing component is provided for a logical path thereby giving a width of a waveform as described above with regard to FIG. 3. The method then advances to operation 172 where the power consumption characteristics for the circuit design are determined. Here, the dynamic and static power consumption may be determined through a suitable tool which will provide the amplitude for the current as described above with regard to FIG. 3. The method then proceeds to operation 174 where a time domain current waveform is constructed from the data provided by operations 170 and 172. For example, the time domain waveform represented by FIG. 4 may be constructed from the data captured above in operation 170 and 172. It should be appreciated that a shape may be assigned to the current waveform based on the width of the waveform and the amplitude of the current, determined by the timing characteristics and the power consumption characteristics, respectively. The time domain waveform is then converted to a frequency domain through a transform function such as a Fast Fourier transform (FFT) in operation 176. In combination with the transfer impedance, which can be determined as described above, the power spectrum for a printed circuit board may be generated so that a designer can determine where to place and an optimum amount of capacitors on the printed circuit board in operation 178.

Figure 10:
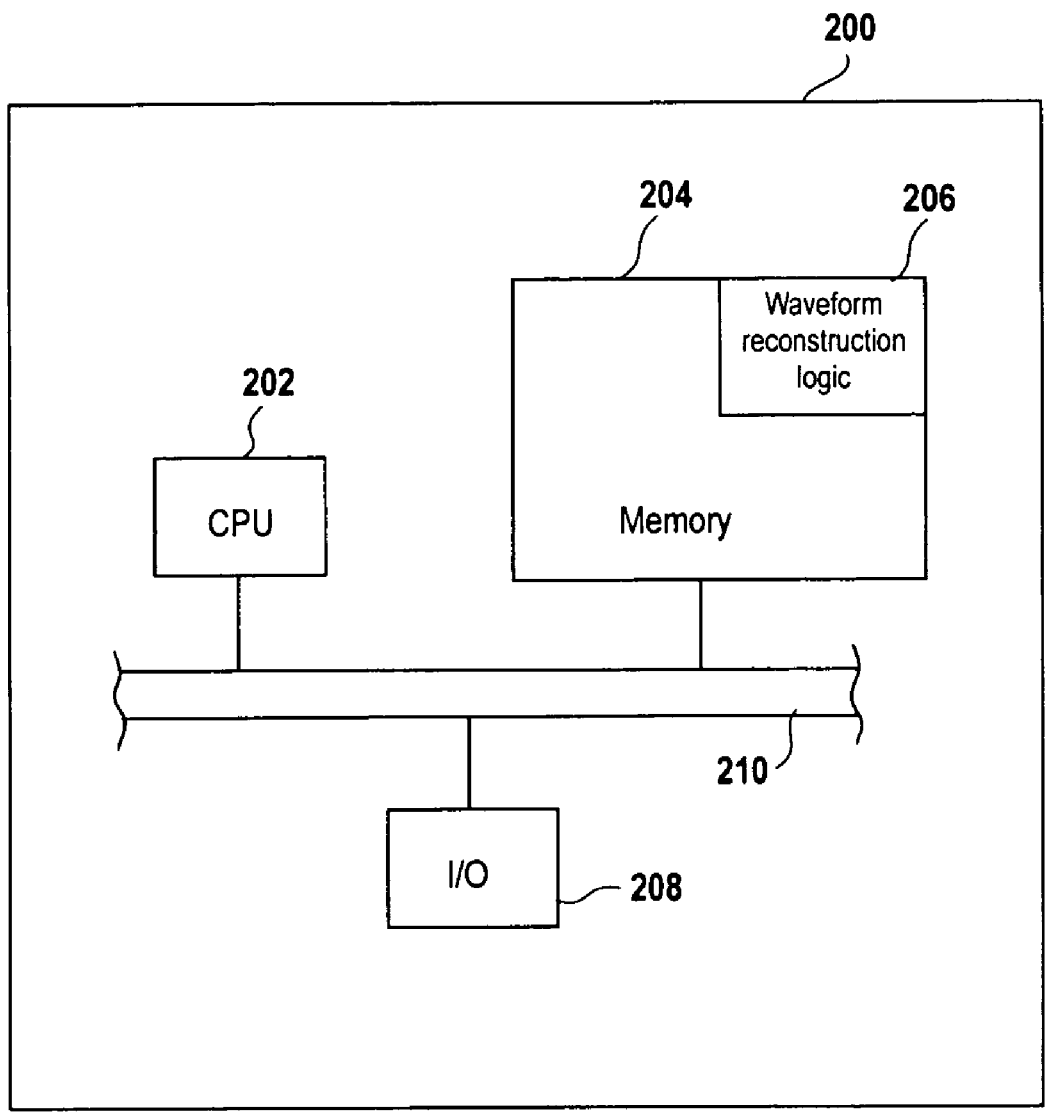
FIG. 10 is a simplified schematic diagram illustrating a system which is capable of determining a dynamic current waveform in accordance with one embodiment of the invention.

FIG. 10 is a simplified schematic diagram illustrating a system which is capable of determining a dynamic current waveform in accordance with one embodiment of the invention. System 200 includes central processing unit (CPU) 202, memory 204, and input/output (I/O) block 208. CPU 202, memory 204, and I/O block 208 are in communication with each other over bus 210. Memory 204 includes waveform reconstruction logic 206. Waveform reconstruction logic 206 is configured to execute the functionality described above with regards to FIGS. 1 through 9. Thus, the waveform reconstruction logic 206 will determine a dynamic current waveform from clock delay time provided through one tool and power consumption provided through another tool in accordance with one embodiment of the invention. In addition, the waveform reconstruction logic 206 will consider the transfer impedance in providing data to a circuit designer so that the circuit designer may optimally place decoupling capacitors on a circuit board for smooth operation with a corresponding chip. Of course, the waveform reconstruction logic may be a module integrated into a synthesis or place and route tool, such as the QUARTUS™ tool available from ALTERA CORPORATION.

The embodiments, thus far, are described with respect to PLDs. The method and apparatus for in-system programmability described herein may be incorporated into any suitable circuit. For example, the method and apparatus may be incorporated into other types of devices such as a programmable array logic (PAL), programmable logic array (PLA), field programmable logic array (FPLA), electrically programmable logic devices (EPLD), electrically erasable programmable logic device (EEPLD), logic cell array (LCA), field programmable gate array (FPGA), application specific standard product (ASSP), application specific integrated circuit (ASIC), just to name a few.

The programmable logic device described herein may be part of a data processing system that includes one or more of the following components; a processor; memory; I/O circuitry; and peripheral devices. The data processing system can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system. In one embodiment, the programmable logic device may be the STRATIX® II GX devices manufactured by ALTERA CORPORATION.

Any of the operations described herein that form part of the invention are useful machine operations. The invention also relates to a device or an apparatus for performing these operations. The apparatus can be specially constructed for the required purpose, or the apparatus can be a general-purpose computer selectively activated, implemented, or configured by a computer program stored in the computer. In particular, various general-purpose machines can be used with computer programs written in accordance with the teachings herein, or it may be more convenient to construct a more specialized apparatus to perform the required operations.

Although the foregoing invention has been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims. In the claims, elements and/or steps do not imply any particular order of operation, unless explicitly stated in the claims.

What is claimed is:

1. A method for determining a current spectrum for a circuit design, comprising;
   determining timing characteristics for the circuit design;
   determining power consumption characteristics for the circuit design;
   constructing a time domain current waveform for the circuit design from the timing characteristics and the power consumption characteristics;
   converting the time domain current waveform to a frequency domain current waveform; and
   identifying a location and an amount of decoupling capacitors for a printed circuit board design housing the circuit design based on the frequency domain current waveform, wherein at least one method operation is executed through a processor.

2. The method of claim 1, wherein the converting of the time domain current waveform to the frequency domain current waveform is achieved through application of a Fast Fourier Transform.

3. The method of claim 1, wherein the constructing comprises:
   determining a current pulse time width; and
   determining an amplitude for the current pulse time width.

4. The method of claim 1, wherein the determining comprises:
   determining dynamic and static power consumption for the circuit design, the dynamic power consumption being based on a percentage of resources switching in the circuit design.

5. The method of claim 1, further comprising;
   calculating an impedance for the printed circuit board design housing the circuit design.

6. The method of claim 5, further comprising:
   applying the calculated impedance to generate a spectrum of noise for the circuit design when placed on the printed circuit board design.

7. The method of claim 1, further comprising:
   generating a circuit having the circuit design; and
   placing the circuit on a printed circuit board generated from the printed circuit board design, the printed circuit board having the amount of decoupling capacitors in the respective locations.

8. A non-transitory computer readable storage medium encoded with machine-executable instructions for determining a current spectrum for a circuit design, the instructions comprising;
   instructions for determining timing characteristics for the circuit design;
   instructions for determining power consumption characteristics for the circuit design;
   instructions for constructing a time domain current waveform for the circuit design from the timing characteristics and the power consumption characteristics;
   instructions for converting the time domain current waveform to a frequency domain current waveform; and
   instructions for identifying a location and an amount of decoupling capacitors for a printed circuit board design housing the circuit design based on the frequency domain current waveform.

9. The computer readable storage medium of claim 8, wherein the instructions for converting include instructions for applying a Fast Fourier Transform.

10. The computer readable storage medium of claim 8, wherein the instructions for constructing the time domain current waveform from the timing characteristics and the power consumption characteristics, comprises:
    instructions for determining a current pulse time width; and
    instructions for assigning an amplitude to the determined current pulse time width.

11. The computer readable storage medium of claim 8, wherein the instructions for determining power consumption characteristics for the circuit design comprises:
    instructions for determining dynamic and static power consumption for the circuit design.

12. The computer readable storage medium of claim 8, further comprising;
    instructions for calculating an impedance for the printed circuit board design housing the circuit design.

13. The computer readable storage medium of claim 12, further comprising:
    instructions for applying the calculated impedance to generate a spectrum of noise for the circuit design when placed on the printed circuit board design.

14. The computer storage readable medium of claim 11, wherein the instructions for determining dynamic and static power consumption for the circuit design assign a percentage of resources of the circuit design to switch at a given time period.

15. A computer system comprising:
    a bus;
    a memory; and
    a processor in communication with the memory through the bus, the processor operable to receive instructions from the memory which, when executed by the processor, cause the processor to perform a method comprising:
    constructing a time domain current waveform for a circuit design from timing characteristics and power consumption characteristics;
    converting the time domain current waveform to a frequency domain current waveform; and
    identifying a location and an amount of decoupling capacitors for a printed circuit board design housing the circuit design based on the frequency domain current waveform.

16. The computer system of claim 15, wherein the timing characteristics and the power consumption characteristics are generated independently and are supplied to the memory from an external tool.

17. The computer system of claim 15, wherein the timing characteristics supply a current pulse time width.

18. The computer system of claim 15, wherein the circuit design is for a programmable logic device.

19. The computer system of claim 15, wherein the power consumption characteristics include a dynamic power consumption based on a percentage of resources in the circuit design switching at a time point, and wherein the power consumption characteristics determine a current amplitude associated with the time domain current waveform.

20. The computer system of claim 15, wherein the memory includes an impedance value representative of an impedance for the printed circuit board design housing the circuit design.

* * * * *